(12) United States Patent
Kim

(10) Patent No.: US 11,107,517 B2
(45) Date of Patent: Aug. 31, 2021

(54) SEMICONDUCTOR MEMORY DEVICE AND METHOD FOR REFRESHING MEMORY WITH REFRESH COUNTER

(71) Applicant: SK hynix Inc., Gyeonggi-do (KR)

(72) Inventor: Kyung-Mook Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/780,377

(22) Filed: Feb. 3, 2020

(65) Prior Publication Data

US 2021/0005246 A1 Jan. 7, 2021

(30) Foreign Application Priority Data

Jul. 1, 2019 (KR) .......................... 10-2019-0078847

(51) Int. Cl.
*G11C 11/406* (2006.01)
*G11C 11/408* (2006.01)
*G11C 29/02* (2006.01)

(52) U.S. Cl.
CPC .... *G11C 11/40618* (2013.01); *G11C 11/4085* (2013.01); *G11C 11/40611* (2013.01); *G11C 29/02* (2013.01)

(58) Field of Classification Search
CPC ......... G11C 11/40618; G11C 11/40611; G11C 11/4085; G11C 29/02
See application file for complete search history.

(56) References Cited

U.S. PATENT DOCUMENTS

2007/0230264 A1* 10/2007 Eto ................... G11C 11/40603
365/222
2009/0154278 A1* 6/2009 Chan-Choi ........... G11C 11/406
365/222
2012/0014199 A1* 1/2012 Narui ................ G11C 11/40611
365/222

FOREIGN PATENT DOCUMENTS

KR 10-2009-0066037 6/2009
KR 10-2014-0029839 3/2014
KR 10-2015-0128087 11/2015

* cited by examiner

*Primary Examiner* — Sultana Begum
(74) *Attorney, Agent, or Firm* — IP & T Group LLP

(57) ABSTRACT

A semiconductor memory device includes: a plurality of banks each suitable for refreshing at least one word line corresponding to a refresh address according to a row active signal; a refresh control circuit suitable for controlling, in response to a refresh command, an activation timing of the row active signal according to mode signals and a counting signal; a refresh counter suitable for generating the counting signal by counting the number of times the row active signal is activated, and generating sequence signals which are sequentially activated; and a detection circuit suitable for generating flag signals by combining the sequence signals, and generating a detection signal according to a corresponding one of the flag signals when any of the mode signals is activated, wherein the refresh counter is initialized by the detection signal.

19 Claims, 14 Drawing Sheets

SEMICONDUCTOR MEMORY DEVICE AND METHOD FOR REFRESHING MEMORY WITH REFRESH COUNTER

CROSS-REFERENCE TO RELATED APPLICATION

The present application claims priority of Korean Patent Application No. 10-2019-0078847, filed on Jul. 1, 2019, which is incorporated herein by reference in its entirety.

BACKGROUND

1. Field

Various embodiments of the present invention relate to a semiconductor designing technology, and more particularly, to a semiconductor memory device performing a refresh operation, and a memory system including a semiconductor memory device.

2. Description of the Related Art

A memory cell of a semiconductor memory device is formed of a transistor serving as a switch and a capacitor for storing a charge (i.e., data). That data is represented by a 'high' (Logic 1) or 'low' (Logic 0) level according to whether or not there is a charge in the capacitor of a memory cell, that is, whether the terminal voltage of the capacitor is high or low.

Since data are stored in the form of charges accumulated in the capacitor, there is no power consumption in principle. However, due to current leakage caused by PN coupling of a transistor and the like, some charge stored in the capacitor is lost. As a result, data may be lost. To prevent this from occurring, the data in the memory cell has to be read before the data is lost, and the cell has to be charged again to the normal level according to the read information. This operation is required to be performed repeatedly at set times, which may be periodic, to retain the data. The process of recharging a memory cell is referred to as a "refresh operation".

There are two types of refresh operations: an auto refresh operation performed when a refresh command is applied from a memory controller to a memory device, and a self refresh operation performed by a memory device itself during a refresh period set by the memory controller. During the auto refresh operation, the memory controller may apply the refresh command several times to the memory device to perform a refresh operation on some or all banks of the memory device. However, in this process, the memory controller may fail to provide a refresh command one or more times or provide an incorrect number of refresh commands due to an operational or communication errors of the memory controller. Thus, the refresh operation for a corresponding bank is not performed, and as a result, stored data is likely to be damaged.

SUMMARY

Embodiments of the present invention are directed to a semiconductor memory device capable of checking whether a refresh command provided from a memory controller during a refresh operation is proper, and a memory system including the semiconductor memory device.

In accordance with an embodiment of the present invention, a semiconductor memory device includes: a plurality of banks each suitable for refreshing at least one word line corresponding to a refresh address according to a row active signal; a refresh control circuit suitable for controlling, in response to a refresh command, an activation timing of the row active signal according to mode signals and a counting signal; a refresh counter suitable for generating the counting signal by counting the number of times the row active signal is activated, and generating sequence signals which are sequentially activated; and a detection circuit suitable for generating flag signals by combining the sequence signals, and generating a detection signal according to a corresponding one of the flag signals when any of the mode signals is activated, wherein the refresh counter is initialized by the detection signal.

In accordance with an embodiment of the present invention, a memory system includes: a memory controller suitable for providing a refresh command with mode signals; and a memory device suitable for generating a row active signal according to the refresh command and the mode signals, and performing a refresh operation on at least one word line corresponding to a refresh address in response to the row active signal, wherein the memory device includes: a refresh control circuit suitable for controlling, in response to the refresh command, an activation timing of the row active signal according to the mode signals and a counting signal; a refresh counter suitable for generating the counting signal by counting the number of times the row active signal is activated, and generating sequence signals which are sequentially activated; and a detection circuit suitable for generating flag signals by combining the sequence signals, and generating the detection signal according to a corresponding one of the flag signals when any of the mode signals is activated, wherein the refresh counter is initialized by the detection signal.

In accordance with an embodiment of the present invention, an operating method of a memory device comprising: activating a row active signal a first number of times respectively at first timings in response to a first refresh command and a first mode signal; refreshing word lines according to the activated row active signal; and activating a flag signal of a set duration at one or more transitions of the activation of the row active signal, wherein the row active signal is activated, a second number of times respectively at second timings in response to a second refresh command and a second mode signal, which are provided within the set duration, wherein a set of the first number and the first timings and a set of the second number and the second timings depend on the first and second mode signals, respectively, and wherein the transitions correspond to the first and second mode signals.

DETAILED DESCRIPTION

Figure 1A:
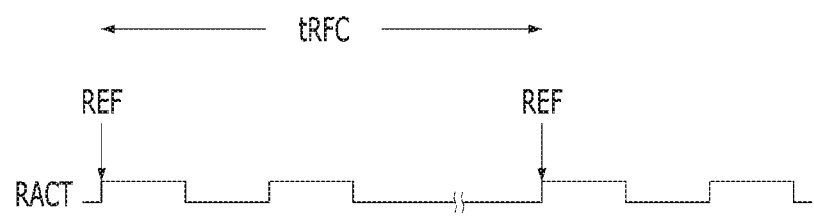
FIGS. 1A and 1B are diagrams describing a refresh operation of a semiconductor memory device.

Various embodiments of the present invention are described below in more detail with reference to the accompanying drawings. In doing so, description of well-known functions or configurations are omitted so as not to unnecessarily obscure the subject matter of the present invention. Throughout the disclosure, like reference numerals refer to like parts throughout the various figures and embodiments of the present invention. Also, throughout the specification, reference to "an embodiment," "another embodiment" or the like is not necessarily to the same embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element that otherwise have the same or similar names. Thus, a first element in one instance could also be termed as a second or third element in another instance without indicating any change to the element itself.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Various embodiments of the present invention are described in detail below with reference to the attached drawings.

Embodiments of the present invention are explained in the context of a row control aspect associated with a refresh operation.

FIG. 1A is a timing diagram describing an advanced refresh operation of a semiconductor memory device.

Referring to FIG. 1A, during a unit refresh cycle tRFC, a row active signal RACT for activating a word line is activated at least twice whenever a refresh command REF is inputted. That is, the advanced refresh operation may activate and refresh two or more word lines in response to the refresh command REF during the unit refresh cycle tRFC. By performing the advanced refresh operation, the semiconductor memory device can maintain data of a memory cell by increasing the number of refresh times or reducing the refresh interval even when a data retention time of the memory cell decreases.

Although FIG. 1A shows that an average number of refresh times per single input of the refresh command REF is 2, this number may vary according to a system design. For example, the refresh operation may be performed once in response to each of first to third inputs of the refresh command REF, and performed twice in response to a fourth input of the refresh command REF, in which case the average number of refresh times per single input of the refresh command REF may be approximately 1.25 (5/4), which means that the refresh operation is performed 5 times while the refresh command REF is inputted 4 times. For reference, the average number of refresh times per single input of the refresh command REF increases as the data retention time decreases.

Figure 1B:
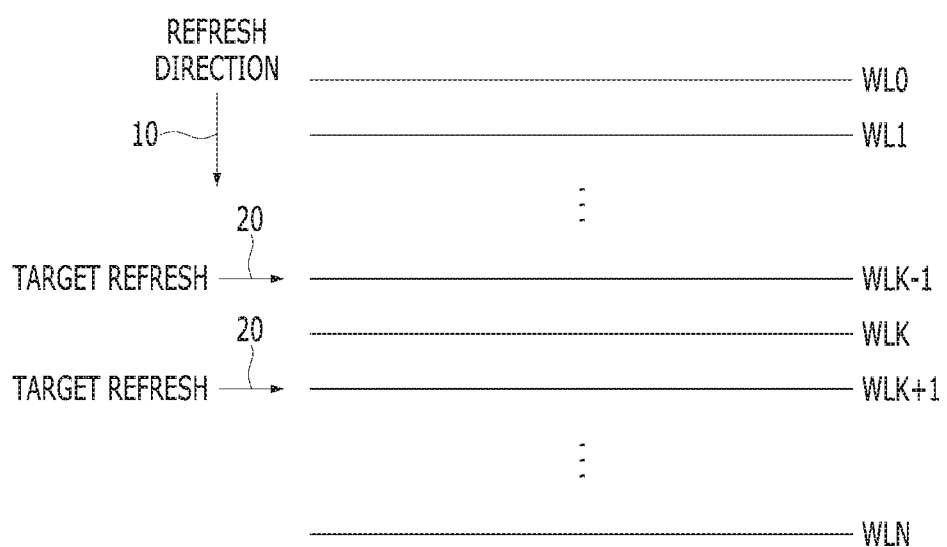

FIG. 1B is a timing diagram describing a target refresh operation of a semiconductor memory device.

Referring to FIG. 1B, first to (N+1)th word lines WL0 to WLN included in a bank are shown. Two types of refresh operations are discussed: a normal refresh operation and a target refresh operation.

When a normal refresh operation is performed, one or more word lines are refreshed whenever a refresh command is inputted, and the first to (N+1)th word lines WL0 to WLN may be sequentially refreshed. In FIG. 13, the normal refresh operation is performed in a direction indicated by arrow 10. After the refresh operation of the (n+1)th word line WLN is completed, the first to (N+1)th word lines WL0 to WLN may be sequentially refreshed again.

When a target refresh operation is performed, selected word lines may be refreshed according to a set condition, as shown in arrows 20 and 30, regardless of the normal refresh operation. The target-refreshed word lines may require an additional refresh operation because it is hard to maintain the data just through the normal refresh operation. Therefore, word lines for the target refresh operation may be selected as the occasion demands. For reference, the target refresh operation may be referred as a "smart refresh operation".

It is assumed that a particular word line WLK has been activated many times, frequently, or for a long time. Data stored in memory cells coupled to word lines WLK−1 and WLK+1, which are disposed adjacent to the word line WLK, may be affected, due to coupling effects between the word line WLK and the adjacent word lines WLK−1 and WLK+1. Such a phenomenon is called "row hammering". Due to the row hammering, the data retention time of the memory cells coupled to the adjacent word lines WLK−1 and WLK+1 may decrease. Thus, the semiconductor memory device may detect the word line WLK according to a set condition, and generate a target address based on the detection result. The target refresh operation may be performed on the adjacent word lines WLK−1 and WLK+1 based on the target address.

A Fine Granularity Refresh (FGR) mode is adopted as a concept of dividing refresh operations to be performed into different types. It is assumed that a set number of refresh operations are performed in response to a single input of a refresh command during a unit refresh cycle (tRFC). In the FGR mode, the set number of refresh operations may be performed in response to 2 or 4 inputs of a refresh command during the unit refresh cycle (tRFC). There are multiple FGR modes including a first mode FGR1, a second mode FGR2 and a third mode FGR4. In the first mode FGR1, a refresh command may be inputted once during the unit refresh cycle (tRFC). In the second mode FGR2, a refresh command may be inputted twice during the unit refresh cycle (tRFC). In the third mode FGR4, a refresh command may be inputted 4 times during the unit refresh cycle (tRFC). Hence, the number following the abbreviation "FGR" is indicative of the number of times a refresh command is input during the tRFC.

Figure 2A:
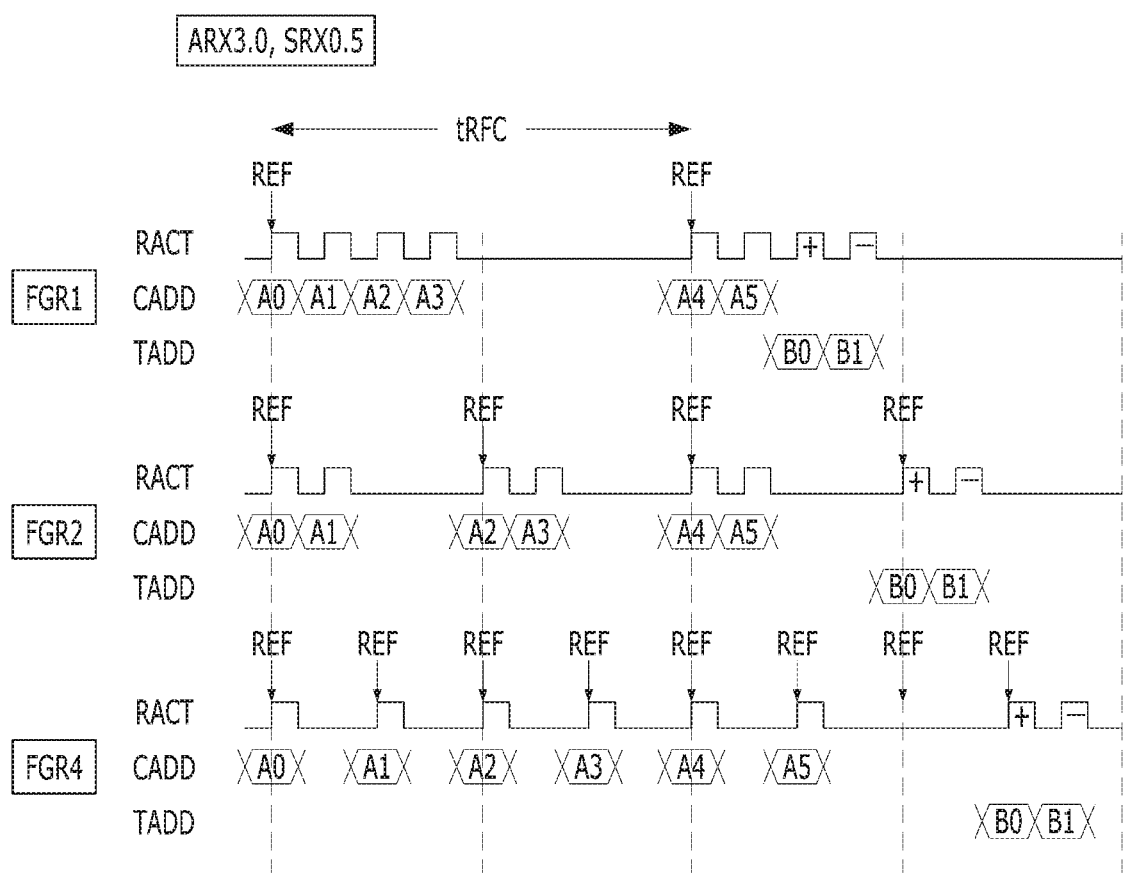
FIGS. 2A to 2C are timing diagrams describing a refresh operation of a semiconductor memory device according to an FGR mode.
Figure 2B:
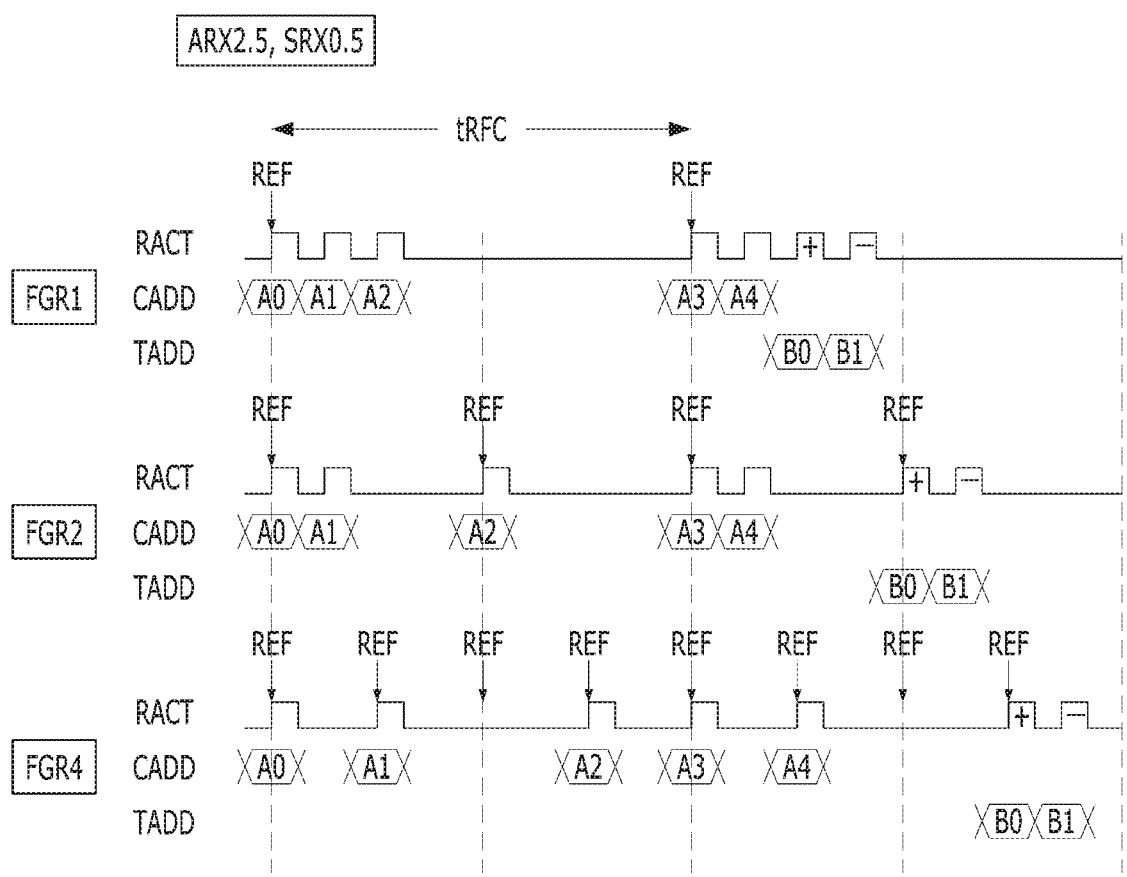
Figure 2C:
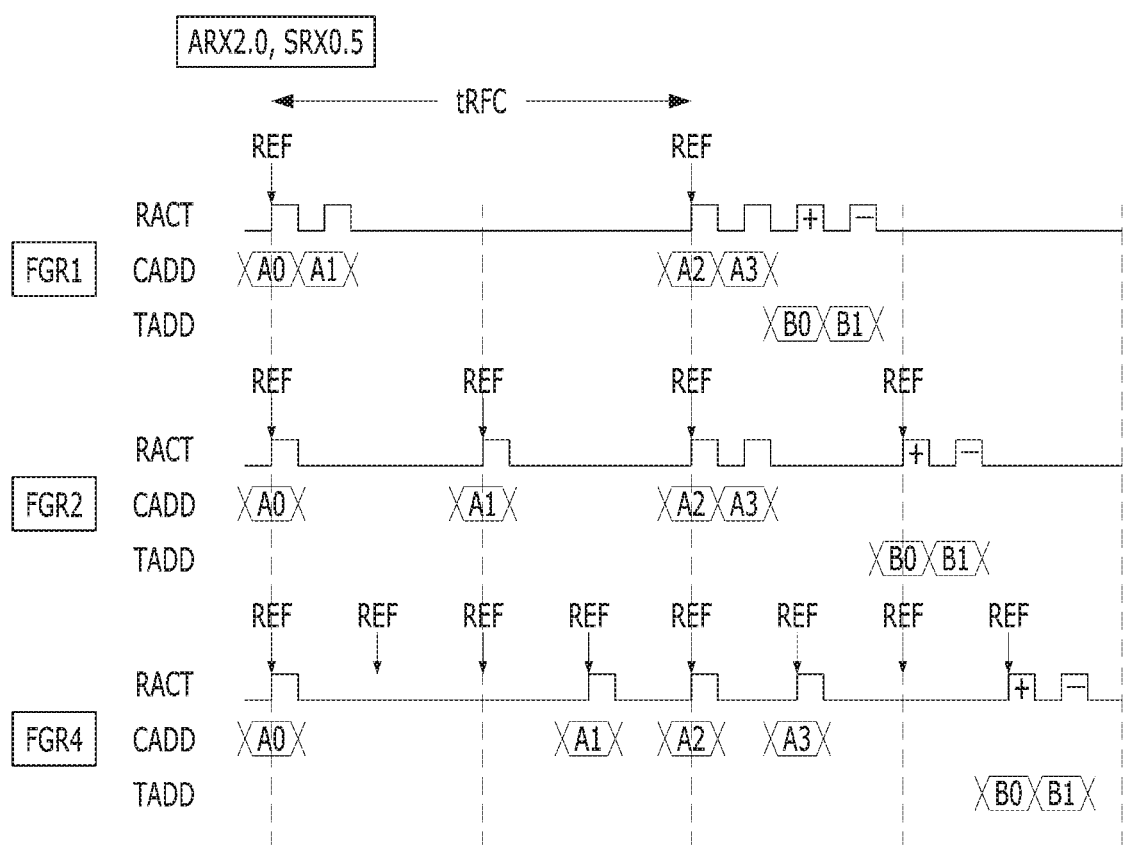

FIGS. 2A to 2C are timing diagrams describing an advanced refresh operation and a target refresh operation of a semiconductor memory device according to an FGR mode.

FIG. 2A shows a case where an average number of times on which an advance refresh operation is performed is 3 (ARX3.0), and an average number of times on which a target refresh operation is performed is 0.5 (SRX0.5), during a unit refresh cycle tRFC.

In a first mode FGR1, the refresh command REF is inputted once during the unit refresh cycle tRFC. For the advance refresh operation, a row active signal RACT may be activated on average 3 times per a single input of the refresh command REF. At this time, a word line to be is refreshed according to the row active signal RACT may be a word line next to a previously refreshed word line. A counting address CADD for designating a word line to be refreshed may be increased by one when the row active signal RACT is activated. For the target refresh operation, the row active signal RACT may be activated on average 0.5 times per a single input of the refresh command REF. To perform the target refresh operation on adjacent word lines (e.g., WLK−1 and WLK+1 of FIG. 1B), a target address TADD may be provided according to a set condition. For reference, in FIG. 2A, the row active signal RACT is consecutively activated twice ("+" and "−") during one target refresh operation, thereby sequentially refreshing the adjacent word lines WLK−1 and WLK+1. That is, in the first mode FGR1 with SRX0.5, the row active signal RACT is consecutively activated twice ("+" and "−") per 2 inputs of the refresh command REF.

In a second mode FGR2, the refresh command REF is inputted twice during the unit refresh cycle tRFC. For the advance refresh operation, the row active signal RACT may be activated on average 1.5 times per a single input of the refresh command REF. For the target refresh operation, the row active signal RACT may be activated on average 0.25 times per a single input of the refresh command REF. Likewise, in the second mode FGR2 with SRX0.5, the row active signal RACT is consecutively activated twice ("+" and "−") per 4 inputs of the refresh command REF.

In a third mode FGR4, the refresh command REF is inputted 4 times during the unit refresh cycle tRFC. For the advance refresh operation, the row active signal RACT may be activated on average 0.75 times per a single input of the refresh command REF. For the target refresh operation, the row active signal RACT may be activated on average 0.125 times per a single input of the refresh command REF. Likewise, in the third mode FGR4 with SRX0.5, the row active signal RACT is consecutively activated twice ("+" and "−") per 8 inputs of the refresh command REF.

As shown in FIG. 2A, in ARX3.0 and SRX0.5, after the row active signal RACT may be consecutively activated 6 times for the advance refresh operation, the row active signal RACT may be consecutively activated 2 times for the target refresh operation, regardless of an FGR mode.

FIG. 2B shows a case where an average number of times on which an advance refresh operation is performed is 2.5 (ARX2.5), and an average number of times on which a target refresh operation is performed is 0.5 (SRX0.5), during a unit refresh cycle tRFC.

In a first mode FGR1, a row active signal RACT may be activated on average 2.5 times for the advance refresh operation, and the row active signal RACT may be activated on average 0.5 times for the target refresh operation, per a single input of the refresh command REF. In a second mode FGR2, the row active signal RACT may be activated on average 1.25 times for the advance refresh operation, and the row active signal RACT may be activated on average 0.25 times for the target refresh operation, per a single input of the refresh command REF. In a third mode FGR4, the row active signal RACT may be activated on average 0.625 times for the advance refresh operation, and the row active signal RACT may be activated on average 0.125 times for the target refresh operation, per a single input of the refresh command REF.

As shown in FIG. 2B, in ARX2.5 and SRX0.5, after the row active signal RACT may be consecutively activated 5 times for the advance refresh operation, the row active signal RACT may be consecutively activated 2 times for the target refresh operation, regardless of an FGR mode.

FIG. 2C shows a case where an average number of times on which an advance refresh operation is performed is 2.0 (ARX2.0), and an average number of times on which a target refresh operation is performed is 0.5 (SRX0.5), during a unit refresh cycle tRFC.

In a first mode FGR1, a row active signal RACT may be activated on average 2.0 times for the advance refresh operation, and the row active signal RACT may be activated on average 0.5 times for the target refresh operation, per a single input of the refresh command REF. In a second mode FGR2, the row active signal RACT may be activated on average 1.0 times for the advance refresh operation, and the row active signal RACT may be activated on average 0.25 times for the target refresh operation, per a single input of the refresh command REF. In a third mode FGR4, the row active signal RACT may be activated on average 0.5 times for the advance refresh operation, and the row active signal RACT may be activated on average 0.125 times for the target refresh operation, per a single input of the refresh command REF.

As shown in FIG. 2C, in ARX2.0 and SRX0.5, after the row active signal RACT may be consecutively activated 4 times for the advance refresh operation, the row active signal RACT may be consecutively activated 2 times for the target refresh operation, regardless of an FGR mode.

The operations illustrated in FIGS. 2A to 2C are just an example. An advanced refresh operation and a target refresh operation of the semiconductor memory device according to the FGR mode can be implemented in various ways. For example, in the third mode FGR4, FIG. 2B shows that the row active signal RACT is not activated in response to a third input of the refresh command REF during the unit refresh cycle tRFC. However, an activation timing of the row active signal RACT may controlled depending on design of the memory system.

According to the memory specification of the particular memory device or operating characteristics thereof, the memory device can change a refresh operation to one of the second mode FGR2 and the third mode FGR4, from the first mode FGR1. Also, the memory device may change a refresh operation only to the first mode FGR1, from the second mode FGR2 or the third mode FGR4. In order to change the refresh operation to the first mode FGR1 from the second mode FGR2 or the third mode FGR4, the refresh command REF is inputted a set number of times, which may be predetermined for each of the second mode FGR2 and the third mode FGR4, during the unit refresh cycle tRFC. However, when the refresh command REF is inputted an incorrect number of times from a memory controller during the unit refresh cycle tRFC such that the operation mode changes from the second mode FGR2 or the third mode FGR4 to the first mode FGR1, the refresh operation may be abnormally performed due to such an improper refresh command. In an embodiment of the present invention, a semiconductor memory device may check whether a refresh command from a memory controller during a refresh operation is proper, and detect the improper refresh command, thereby stably performing a refresh operation according to the refresh command.

Figure 3:
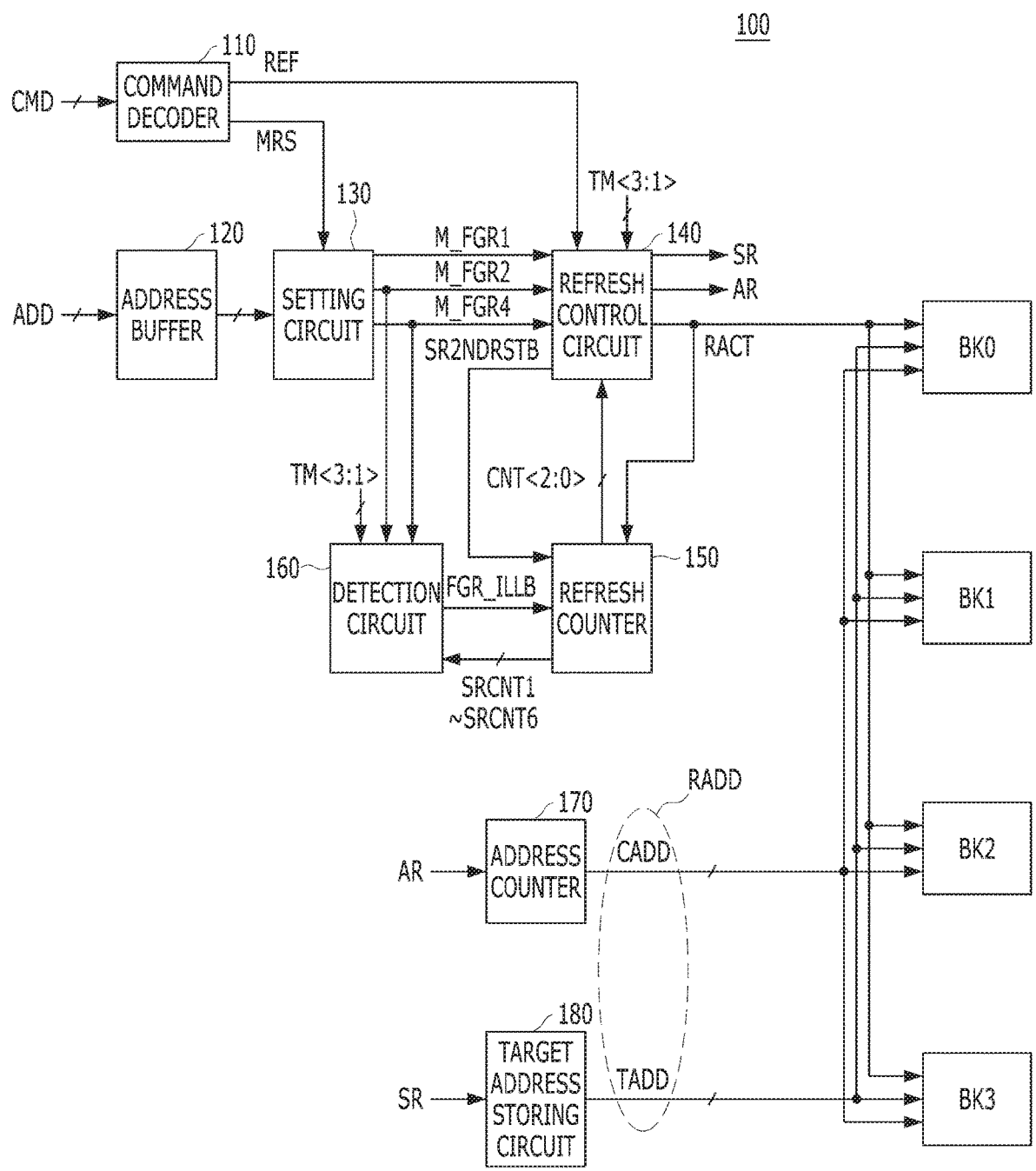
FIG. 3 is a block diagram illustrating a semiconductor memory device in accordance with an embodiment of the present invention.

FIG. 3 is a block diagram illustrating a semiconductor memory device 100 in accordance with an embodiment of the present invention.

Referring to FIG. 3, the semiconductor memory device 100 may include first to fourth memory banks BK0 to BK3, a command decoder 110, an address buffer 120, a setting circuit 130, a refresh control circuit 140, a refresh counter 150, a detection circuit 160, an address counter 170, and a target address storing circuit 180.

The first to fourth banks BK0 to BK3 may include a plurality of memory cells (not shown) disposed in an array at intersections of a plurality of word lines (not shown) and a plurality of bit lines (not shown). Although not shown, each of the first to fourth banks BK0 to BK3 may include a plurality of cell matrix (not shown) and a plurality of sense amplifiers (not shown) which are shared by adjacent cell matrix.

The first to fourth banks BK0 to BK3 may be activated according to a row active signal RACT to access/activate at least one word line corresponding to a refresh address RADD. The refresh address RADD may include a counting address CADD and a target address TADD.

Although FIG. 3 shows that the semiconductor memory device 100 includes four banks BK0 to BK3, the present invention is not limited thereto. The semiconductor memory device 100 may be implemented with any suitable number of banks. Further, though FIG. 3 shows that all banks BK0 to BK3 are activated according to the same row active signal RACT, the present invention is not limited thereto. According to an embodiment, instead of all banks being activated simultaneously, the banks may be activated sequentially with a set time in between each activation. In another embodiment, the banks may be independently activated by assigning a plurality of row active signals to each bank.

The command decoder 110 may decode a command CMD provided from an external device (not shown), e.g., a memory controller, and generate a mode setting command MRS and a refresh command REF. Further, the command decoder 110 may generate an active command (ACT), a precharge command (PCG) regarding a data access operation, and a read command (RD) and a write command (WT) regarding a data input/output operation.

In an embodiment of the present invention, the mode setting command MRS and the refresh command REF regarding a refresh operation will be described.

The address buffer 120 may buffer an address ADD provided from the memory controller, and transfer the buffered address ADD to inside. The command CMD and the address ADD may be composed of multiple bits.

The setting circuit 130 may set first to third mode signals M_FGR1, M_FGR2, and M_FGR4 for setting a Fine Granularity Refresh (FGR) mode, using the address ADD transferred from the address buffer 120, according to a setting signal, i.e., the mode setting command MRS.

The first to third mode signals M_FGR1 to M_FGR4 may define the number of times the refresh command REF is inputted during a unit refresh cycle (tRFC). For example, the first mode signal M_FGR1 may define a first mode FGR1 in which the refresh command REF is inputted once during the unit refresh cycle (tRFC). The second mode signal M_FGR2 may define a second mode FGR2 in which the refresh command REF is inputted twice during the unit refresh cycle (tRFC). The third mode signal M_FGR4 may define a third mode FGR4 in which the refresh command REF is inputted 4 times during the unit refresh cycle (tRFC).

The refresh control circuit 140 may generate the row active signal RACT when the refresh command REF is inputted. The refresh control circuit 140 may control an activation timing of the row active signal RACT according to the first to third mode signals M_FGR1 to M_FGR4 and a counting signal CNT<2:0>. When the refresh command REF is inputted, the refresh control circuit 140 may generate an advanced signal AR and a target signal SR according to a rate setting signal TM<3:1>, in addition to the first to third mode signals M_FGR1 to M_FGR4 and the counting signal CNT<2:0>. The advanced signal AR may be activated for an advanced refresh operation, and the target signal SR may be activated for a target refresh operation. The refresh control circuit 140 may activate the row active signal RACT according to the advanced signal AR and the target signal TR. The refresh control circuit 140 may control an activation timing of the row active signal RACT for the target refresh operation, after controlling an activation timing of the row active signal RACT for the advanced refresh operation. The refresh control circuit 140 may generate a target completion signal SR2NDRSTB when the target refresh operation is finished.

The rate setting signal TM<3:1> may define an average number of refresh times (referred to as a "refresh rate") per a single input of the refresh command REF. The rate setting signal TM<3:1> may be set according to a data retention time of memory cells, and be composed of multi bits. According to an activated bit among multi bits of the rate setting signal TM<3:1>, the advanced refresh operation and the target refresh operation are performed with a refresh rate as shown in FIGS. 2A to 2C. For example, when a first bit TM<1> of the rate setting signal TM<3:1> is activated to a logic high level, the advanced refresh operation and the target refresh operation are performed with a refresh rate of [ARX3.0, SRX0.5] as shown in FIG. 2A. When a second bit TM<2> of the rate setting signal TM<3:1> is activated to a logic high level, the advanced refresh operation and the target refresh operation are performed with a refresh rate of [ARX2.5, SRX0.5] as shown in FIG. 2B. When a third bit TM<3> of the rate setting signal TM<3:1> is activated to a logic high level, the advanced refresh operation and the target refresh operation are performed with a refresh rate of [ARX2.0, SRX0.5] as shown in FIG. 2C.

The refresh counter 150 may generate the counting signal CNT<2:0> by counting an activation number of the row active signal RACT. For example, the refresh counter 150 may increase a value of the counting signal CNT<2:0> by one in synchronization with a falling edge of the row active signal RACT. The refresh counter 150 may generate first to sixth sequence signals SRCNT1 to SRCNT6, which are sequentially activated according to the counting signal CNT<2:0>. The refresh counter 150 may be initialized by the target completion signal SR2NDRSTB or a detection signal FGR_ILLB, which detects an improper refresh command.

The detection circuit 160 may generate first and second flag signals (FGR2_FLAG and FGR4_FLAG of FIG. 6) by combining the first to sixth sequence signals SRCNT1 to SRCNT6. The first and second flag signals FGR2_FLAG and FGR4_FLAG may correspond to the second mode signal M_FGR2 and the third mode signal M_FGR4, respectively. When one of the second mode signal M_FGR2 and the third mode signal M_FGR4 is activated, the detection circuit 160 may generate the detection signal FGR_ILLB according to a corresponding flag signal. Preferably, the detection circuit 160 may generate the first and second flag signals FGR2_FLAG and FGR4_FLAG by combining the first to sixth sequence signals SRCNT1 to SRCNT6, according to the rate setting signal TM<3:1>. When the second mode signal M_FGR2 is activated, the detection circuit 160 may generate the detection signal FGR_ILLB according to the first flag signal FGR2_FLAG. When the third mode signal M_FGR4 is activated, the detection circuit 160 may generate the detection signal FGR_ILLB according to the second flag signal FGR4_FLAG.

The address counter 170 may generate the counting address CADD according to the row active signal RACT during the advanced refresh operation. The address counter 170 may increase the counting address CADD by one whenever the advanced signal AR is activated, and provide the counting address CADD to the first to fourth banks BK0 to BK3.

The target address storing circuit 180 may store a plurality of addresses. The target address storing circuit 180 may provide the target address TADD to the first to fourth banks BK0 to BK3 by selecting at least one of the stored addresses according to the row active signal RACT during the target refresh operation. The target address storing circuit 180 may select one of the stored addresses to provide the target address TADD to the first to fourth banks BK0 to BK3, whenever the target signal SR is activated. The stored addresses may include addresses for designating adjacent word lines (WLK−1 and WLK+1 of FIG. 1B), which have cell characteristics deteriorated due to the row hammering. In addition to storing the addresses described above, the target address storing circuit 180 of FIG. 3 may receive an additional address from the memory controller to provide as the target address TADD to the first to fourth banks BK0 to BK3.

Figure 4A:
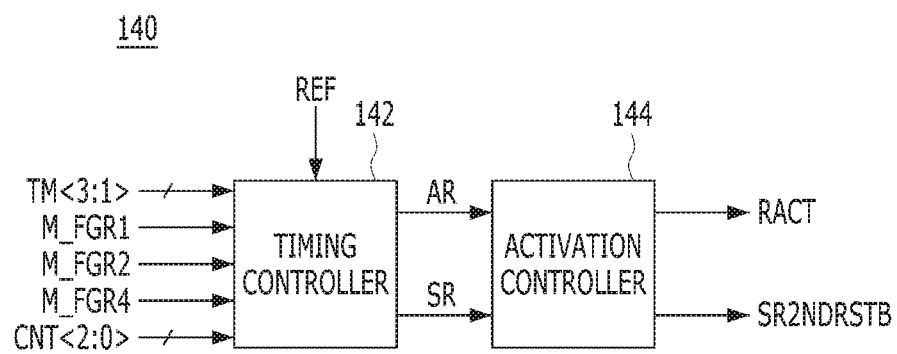
FIGS. 4A and 4B are a block diagram and a timing diagram respectively, each illustrating a refresh control circuit, such as that shown in FIG. 3.
Figure 4B:
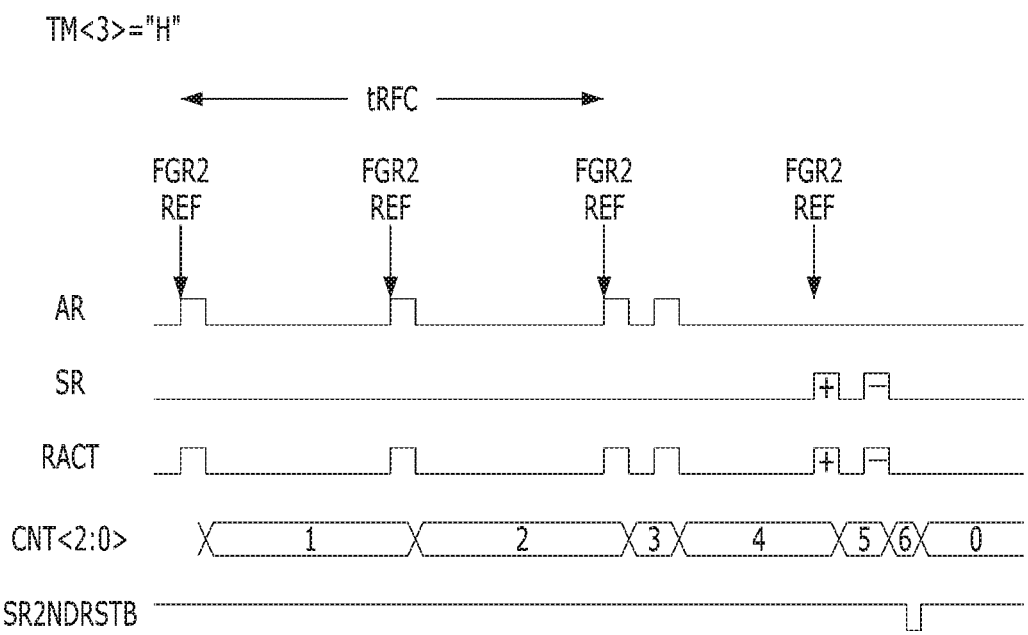

FIGS. 4A and 4B are a block diagram and a timing diagram each illustrating the refresh control circuit 140 shown in FIG. 3.

Referring to FIG. 4A, the refresh control circuit 140 may include a timing controller 142 and an activation controller 144.

The timing controller 142 may generate the advanced signal AR and the target signal SR according to the first to third mode signals M_FGR1 to M_FGR4, the counting signal CNT<2:0>, and the rate setting signal TM<3:1>, when the refresh command REF is inputted.

The activation controller 144 may control the activation timing of the row active signal RACT in response to the advanced signal AR and the target signal SR. The activation controller 144 may activate the row active signal RACT for the advanced refresh operation in response to the advanced signal AR, and activate the row active signal RACT for the target refresh operation in response to the target signal SR. The activation controller 144 may generate the target completion signal SR2NDRSTB activated when the target refresh operation is finished.

Referring to FIG. 4B, when the third bit TM<3> of the rate setting signal TM<3:1> is activated to a logic high level, the advanced refresh operation and the target refresh operation are performed with a refresh rate of [ARX2.0, SRX0.5].

The refresh command REF is inputted twice during a unit refresh cycle tRFC, with a second mode FGR2. The timing controller 142 consecutively activates the target signal SR ("+" and "−") after the advanced signal AR 4 times. The activation controller 144 activates the row active signal RACT for the advanced refresh operation in response to the advanced signal AR, and then activate the row active signal RACT for the target refresh operation in response to the target signal SR. The activation controller 144 activates the target completion signal SR2NDRSTB to be a logic low level after the target signal SR is consecutively activated ("+" and "−"). For reference, the refresh counter 150 increases a value of the counting signal CNT<2:0> by one in synchronization with a falling edge of the row active signal RACT, and initializes the counting signal CNT<2:0> according as the target completion signal SR2NDRSTB is activated.

Figure 5:
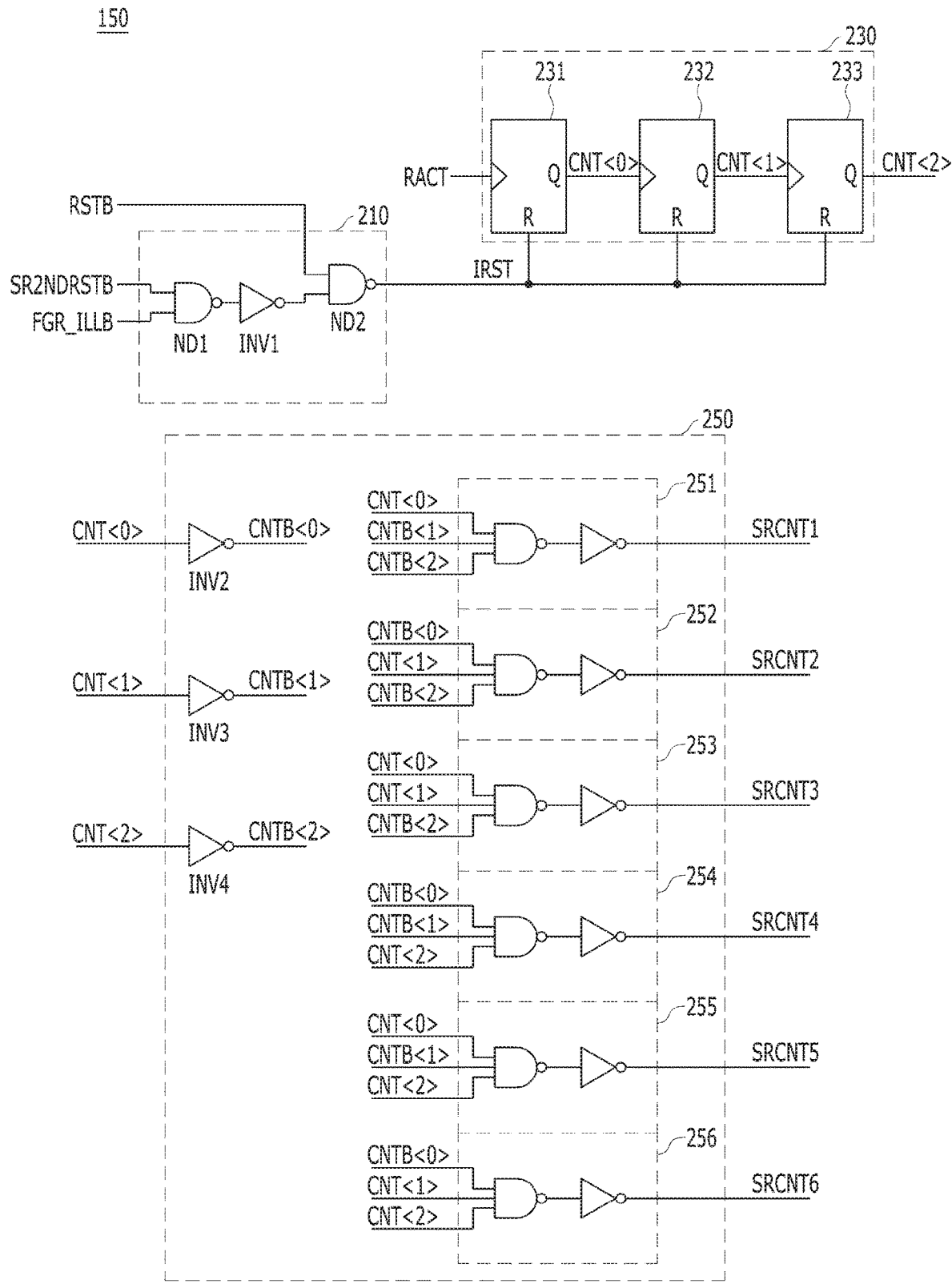
FIG. 5 is a circuit diagram illustrating a refresh counter, such as that of FIG. 3.

FIG. 5 is a circuit diagram illustrating the refresh counter 150 of FIG. 3.

Referring to FIG. 5, the refresh counter 150 may include a reset generator 210, a counter 230, and a sequence generator 250.

The reset generator 210 may generate an internal reset signal IRST when the target completion signal SR2NDRSTB or the detection signal FGR_ILLB is activated to a logic low level. The internal reset signal IRST may be activated to a logic high level. In case where a global reset signal RSTB for initializing all components of the semiconductor memory device 100 is provided, the reset generator 210 may generate the internal reset signal IRST activated when the target completion signal SR2NDRSTB, the detection signal FGR_ILLB or global reset signal RSTB is activated to a logic low level. In detail, the reset generator 210 may include a first inverter INV1, and first and second NAND gates ND1 and ND2. The first NAND gate ND1 and the first inverter INV1 may perform a logic AND operation on the target completion signal SR2NDRSTB and the detection signal FGR_ILLB. The second NAND gate ND2 may perform a logic NAND operation on an output of the first inverter INV1 and the global reset signal RSTB. The reset generator 210 is not limited to the configuration shown in FIG. 5, but can be implemented in various ways.

The counter 230 may count the number of times the row active signal RACT is activated to generate the counting signal CNT<2:0>. For example, the counter 230 may include a 3-bit counter which increase a value of the counting signal CNT<2:0> by one in synchronization with a falling edge of the row active signal RACT. The counter 230 may be initialized by the internal reset signal IRST. In detail, the counter 230 may include first to third unit counters 231 to 233 which are coupled in series and receive the internal reset signal IRST through a reset terminal (R). The first unit counter 231 may receive the row active signal RACT through a clock terminal, and each of the second and third counters 232 and 233 may receive a signal at an output terminal (Q) of a previous stage through a clock terminal. The respective bits of the counting signal CNT<2:0> may be outputted from the output terminal (Q) of each of the first to third unit counters 231 to 233.

The sequence generator 250 may combine respective bits of the counting signal CNT<2:0> to generate the first to sixth sequence signals SRCNT1 to SRCNT6, which are sequentially activated. In detail, the sequence generator 250 may include second to fourth inverters INV2 to INV4, and first to sixth logic combiners 251 to 256. The second to fourth inverters INV2 to INV4 may invert respective bits of the counting signal CNT<2:0> to generate an inverted counting signal CNTB<2:0>. The first to sixth logic combiners 251 to 256 may perform a logic AND operation on at least one bit of the counting signal CNT<2:0> and at least one bit of the inverted counting signal CNTB<2:0>, to output the first to sixth sequence signals SRCNT1 to SRCNT6. For example, the first logic combiner 251 may perform a logic AND operation on a first bit CNT<0> of the counting signal CNT<2:0> and second and third bits CNTB<2:1> of the inverted counting signal CNTB<2:0>, to output the first sequence signal SRCNT1. For example, the sixth logic combiner 256 may perform a logic AND operation on second and third bits CNT<2:1> of the counting signal CNT<2:0> and a first bit CNTB<0> of the inverted counting signal CNTB<2:0>, to output the sixth sequence signal SRCNT6.

As described above, the sequence generator 250 may generate the first to sixth sequence signals SRCNT1 to SRCNT6, which are sequentially activated, whenever the row active signal RACT is activated.

Figure 6:
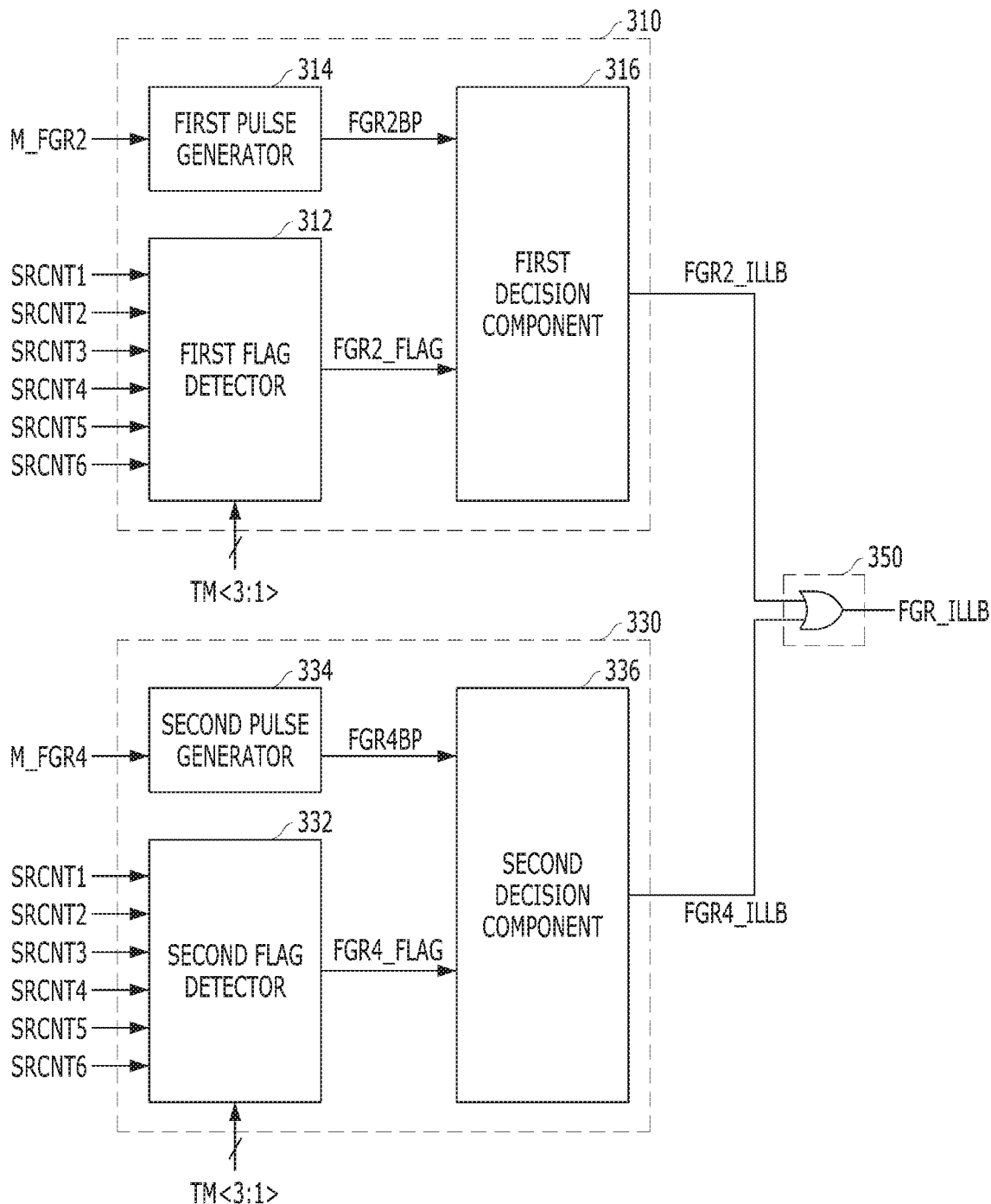
FIG. 6 is a circuit diagram illustrating a detection circuit, such as that of FIG. 3.
Figure 7:
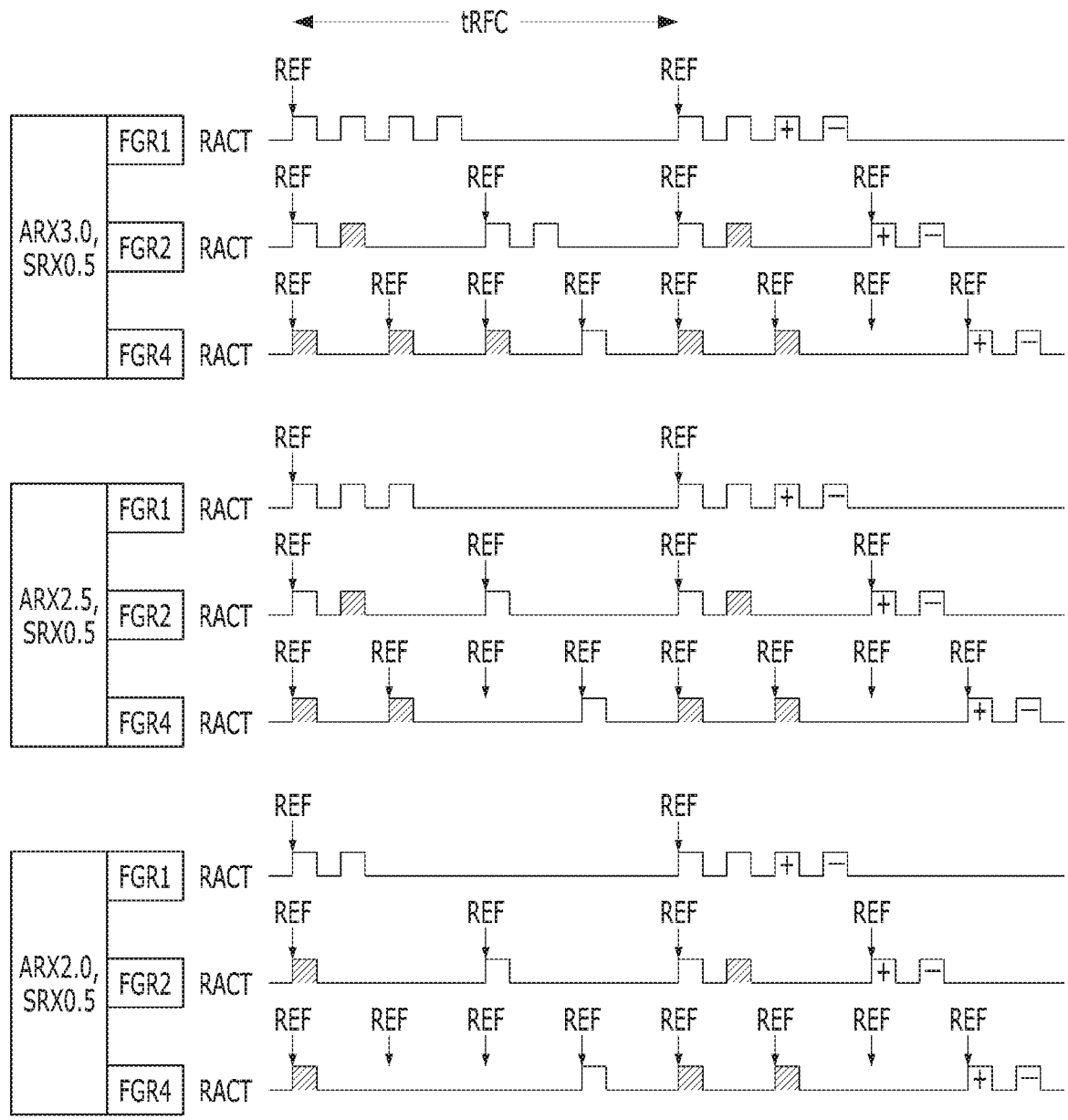
FIG. 7 is a timing diagram illustrating operational details of a detection circuit, such as that of FIG. 6.

FIG. 6 is a circuit diagram illustrating the detection circuit 160 of FIG. 3. FIG. 7 is a timing diagram to help understand the detection circuit 160 of FIG. 6.

Referring to FIG. 6, the detection circuit 160 may include a first detection circuit 310 and a second detection circuit 330.

The first detection circuit 310 may generate the first flag signal FGR2_FLAG by detecting an improper refresh command in the second mode FGR2. The first detection circuit 310 may combine the first to sixth sequence signals SRCNT1 to SRCNT6 according to the rate setting signal TM<3:1> to generate the first flag signal FGR2_FLAG. The first detection circuit 310 may generate a first detection signal FGR2_ILLB according to the first flag signal FGR2_FLAG and the second mode signal M_FGR2. Thus, FGR2_ILLB indicates an improper refresh command.

In detail, the first detection circuit 310 may include a first flag detector 312, a first pulse generator 314, and a first decision component 316.

The first flag detector 312 may combine the first to sixth sequence signals SRCNT1 to SRCNT6 according to the rate setting signal TM<3:1> to generate the first flag signal FGR2_FLAG.

The first pulse generator 314 may generate a first pulse signal FGR2BP pulsing for a given time, when the second mode signal M_FGR2 is activated. Preferably, the first pulse generator 314 may activate the first pulse signal FGR2BP to a logic high level for the given time, in synchronization with a falling edge of the second mode signal M_FGR2.

The first decision component 316 may output the first flag signal FGR2_FLAG as the first detection signal FGR2_ILLB according to the first pulse signal FGR2BP.

The second detection circuit 330 may generate the second flag signal FGR4_FLAG by detecting an improper refresh command in the third mode FGR4. The second detection circuit 330 may combine the first to sixth sequence signals SRCNT1 to SRCNT6 according to the rate setting signal TM<3:1> to generate the second flag signal FGR4_FLAG. The second detection circuit 330 may generate a second detection signal FGR4_ILLB according to the second flag signal FGR4_FLAG and the third mode signal M_FGR4. Thus, FGR4_ILLB is indicative of an improper refresh command.

In detail, the second detection circuit 330 may include a second flag detector 332, a second pulse generator 334, and a second decision component 336.

The second flag detector 332 may combine the first to sixth sequence signals SRCNT1 to SRCNT6 according to the rate setting signal TM<3:1> to generate the second flag signal FGR4_FLAG.

The second pulse generator 334 may generate a second pulse signal FGR2BP pulsing for a given time, when the third mode signal M_FGR4 is activated. Preferably, the second pulse generator 334 may activate the second pulse signal FGR4BP to a logic high level for the given time, in synchronization with a falling edge of the third mode signal M_FGR4.

The second decision component 336 may output the second flag signal FGR4_FLAG as the second detection signal FGR4_ILLB according to the second pulse signal FGR4BP.

The detection circuit 160 may further include a signal output section 350 for outputting the detection signal FGR_ILLB according to the first detection signal FGR2_ILLB or the second detection signal FGR4_ILLB. Although FIG. 6 shows the signal output component 350 which performs a logic OR operation on the first detection signal FGR2_ILLB or the second detection signal FGR4_ILLB, the present invention is not limited thereto. According to an embodiment, the signal output component 350 can be omitted. The first detection signal FGR2_ILLB or the second detection signal FGR4_ILLB are outputted at a common node/connection, and provided to the refresh counter 260, or the first detection signal FGR2_ILLB or the second detection signal FGR4_ILLB are separately provided to the refresh counter 260.

Among the first to sixth sequence signals SRCNT1 to SRCNT6, sequence signals combined by the first flag detector 312 and the second flag detector 332 may be selected according to the refresh rate and the FGR mode.

Referring to FIG. 7, an activation timing of the row active signal RACT according to the refresh rate and the FGR mode is shown.

According to a memory specification, in order to change a refresh operation to the first mode FGR1 from the second mode FGR2 or the third mode FGR4, the refresh command REF should be inputted a set number of times, which may be predetermined for the second mode FGR2 or the third mode FGR4, during a unit refresh cycle tRFC.

In case of a refresh rate of [ARX3.0, SRX0.5] and the second mode FGR2, the refresh command REF is inputted twice during the unit refresh cycle tRFC. It is assumed that a first refresh command REF of the second mode FGR2 is inputted and then a second refresh command REF of the first mode FGR1 is inputted. The detection circuit 160 may determine that the second refresh command REF of the first mode FGR1 is improper by verifying the row active signal RACT (shadowed portion) which has been last activated, according to the first refresh command REF of the second mode FGR2.

That is, to detect the improper refresh command in the first mode FGR1, the detection circuit 160 may verify the second and sixth sequence signals SRCNT2 and SRCNT6 in case of the second mode FGR2 and the refresh rate of [ARX3.0, SRX0.5]. The detection circuit 160 may verify the second and fifth sequence signals SRCNT2 and SRCNT5 in case of the second mode FGR2 and the refresh rate of [ARX2.5, SRX0.5]. The detection circuit 160 may verify the first and fourth sequence signals SRCNT1 and SRCNT4 in case of the second mode FGR2 and the refresh rate of [ARX2.0, SRX0.5].

Further, in case of the refresh rate of [ARX3.0, SRX0.5] and the third mode FGR4, the refresh command REF is inputted 4 times during the unit refresh cycle tRFC. It is assumed that a first refresh command REF of the third mode FGR4 is inputted, and then any of second to fourth refresh commands REF of the first mode FGR1 is inputted. The detection circuit 160 may determine that the second refresh command REF of the first mode FGR1 is improper by verifying the row active signal RACT (shadowed portion) which has been activated according to the first refresh command REF of the third mode FGR4. Also, the detection circuit 160 may determine that the third refresh command REF of the first mode FGR1 is improper by verifying the row active signal RACT (shadowed portion) which has been activated according to the second refresh command REF of the third mode FGR4. Also, the detection circuit 160 may determine that the fourth refresh command REF of the first mode FGR1 is improper by verifying the row active signal RACT (shadowed portion) which has been activated according to the third refresh command REF of the third mode FGR4.

That is, to detect the improper refresh command of the first mode FGR1 in the third mode FGR4, the detection circuit 160 may verify the first, second, third, fifth and sixth sequence signals SRCNT1, SRCNT2, SRCNT3, SRCNT5 and SRCNT6 in case of the third mode FGR4 and the refresh rate of [ARX3.0, SRX0.5]. The detection circuit 160 may verify the first, second, fourth and fifth sequence signals SRCNT1, SRCNT2, SRCNT4 and SRCNT5 in case of the third mode FGR4 and the refresh rate of [ARX2.5, SRX0.5]. The detection circuit 160 may verify the first, third and fourth sequence signals SRCNT1, SRCNT3 and SRCNT4 in case of the third mode FGR4 and the refresh rate of [ARX2.0, SRX0.5].

Figure 8:
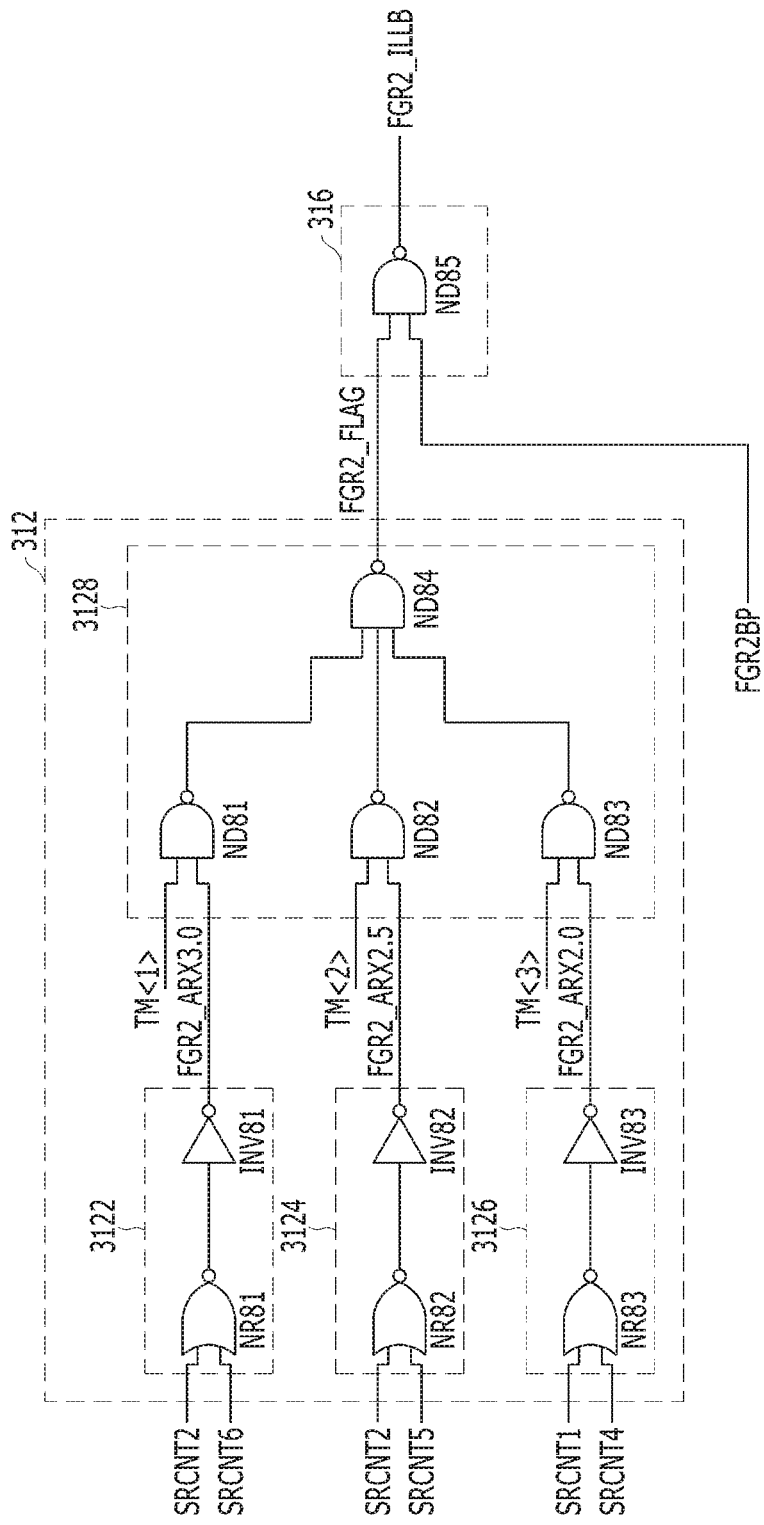
FIG. 8 is a detailed circuit diagram illustrating a first detection circuit, such as that of FIG. 6.

FIG. 8 is a detailed circuit diagram illustrating the first detection circuit 310 of FIG. 6.

Referring to FIG. 8, the first flag detector 312 and the first decision component 316 of the first detection circuit 310 are shown.

The first flag detector 312 may include first to third preliminary detectors 3122 to 3126, and a first flag generator 3128.

The first to third preliminary detectors 3122 to 3126 may generate first to third preliminary signals FGR2_ARX3.0, FGR2_ARX3.0, and FGR2_ARX3.0 by combining two or more signals of the first to sixth sequence signals SRCNT1 and SRCNT6. For example, the first preliminary detector 3122 may generate the first preliminary signal FGR2_ARX3.0 when any of the second and sixth sequence signals SRCNT2 and SRCNT6 is activated. The second preliminary detector 3124 may generate the second preliminary signal FGR2_ARX2.5 when any of the second and fifth sequence signals SRCNT2 and SRCNT5 is activated. The third preliminary detector 3126 may generate the third preliminary signal FGR2_ARX2.0 when any of the first and fourth sequence signals SRCNT1 and SRCNT4 is activated.

For example, the first and third preliminary detectors 3122 to 3126 may include first to third NOR gates NR81 to NR83, and first to third inverters INV81 to INV83.

The first flag generator 3128 may select any of the first to third preliminary signals FGR2_ARX3.0, FGR2_ARX2.5, and FGR2_ARX2.0 according to the rate setting signal TM<3:1> to generate the first flag signal FGR2_FLAG. The first flag generator 3128 may output the first preliminary signal FGR2_ARX3.0 as the first flag signal FGR2_FLAG when the first bit TM<1> of the rate setting signal TM<3:1> is activated. The first flag generator 3128 may output the second preliminary signal FGR2_ARX2.5 as the first flag signal FGR2_FLAG when the second bit TM<2> of the rate setting signal TM<3:1> is activated. The first flag generator 3128 may output the third preliminary signal FGR2_ARX2.0 as the first flag signal FGR2_FLAG when the third bit TM<3> of the rate setting signal TM<3:1> is activated. For example, the first flag generator 3128 may include first to fourth NAND gates ND81 to ND84. The first to third NAND gates ND81 to ND83 may perform a logic NAND operation on the first to third bits of the rate setting signal TM<3:1> and the first to third preliminary signals FGR2_ARX3.0, FGR2_ARX2.5, and FGR2_ARX2.0, respectively. The fourth NAND gate ND84 may perform a logic NAND operation on outputs of the first to third NAND gates ND81 to ND83.

The first decision component 316 may deactivate the first detection signal FGR2_ILLB to a logic high level when the first pulse signal FGR2BP is deactivated to a logic low level. The first decision component 316 may invert the first flag signal FGR2_FLAG to output the first detection signal FGR2_ILLB, when the first pulse signal FGR2BP is activated to a logic high level. For example, the first decision component 316 may include a fifth NAND gate ND85 for performing a logic NAND operation on the first pulse signal FGR2BP and the first flag signal FGR2_FLAG.

Figure 9:
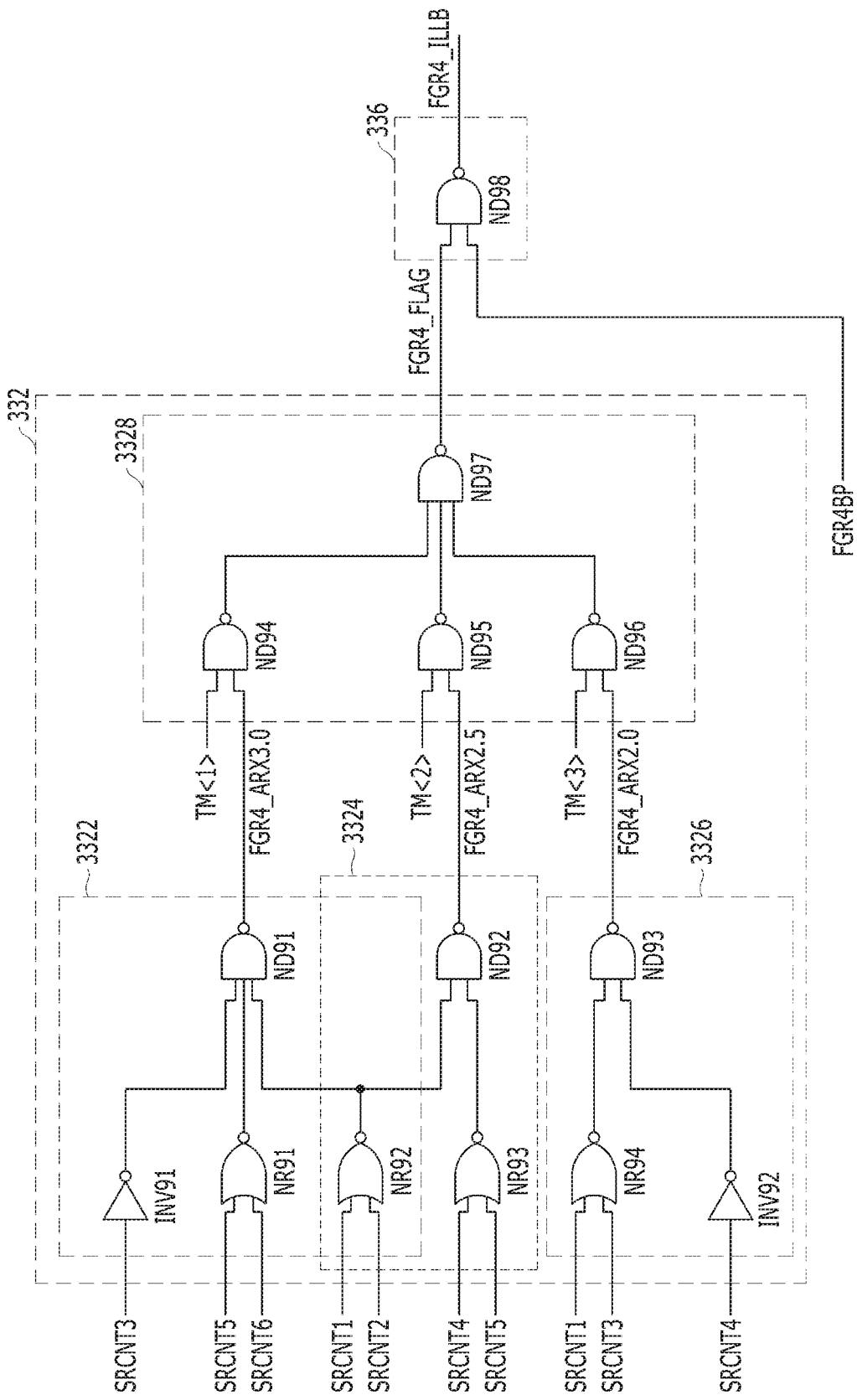
FIG. 9 is a detailed circuit diagram illustrating a second detection circuit, such as that of FIG. 6.

FIG. 9 is a detailed circuit diagram illustrating the second detection circuit 330 of FIG. 6.

Referring to FIG. 9, the second flag detector 332 and the second decision component 336 of the second detection circuit 330 are shown.

The second flag detector 332 may include fourth to sixth preliminary detectors 3322 to 3326, and a second flag generator 3328.

The fourth to sixth preliminary detectors 3322 to 3326 may generate fourth to sixth preliminary signals FGR4_ARX3.0, FGR4_ARX2.5 by combining three or more signals of the first to sixth sequence signals SRCNT1 and SRCNT6.

The fourth preliminary detector 3322 may generate the fourth preliminary signal FGR4_ARX3.0 when any of the first, second, third, fifth and sixth sequence signals SRCNT1, SRCNT2, SRCNT3, SRCNT5 and SRCNT6 is activated. For example, the fourth preliminary detector 3322 may include the first inverter INV91, first and second NOR gates NR91 and NR92, and a first NAND gate ND91. The first NOR gate NR91 may perform a logic NOR operation on the fifth and sixth sequence signals SRCNT5 and SRCNT6. The second NOR gate NR92 may perform a logic NOR operation on the first and second sequence signals SRCNT1 and SRCNT2. The first inverter INV91 may invert the third sequence signal SRCNT3. The first NAND gate ND91 may perform a logic NAND operation on outputs of the first inverter INV91 and the first and second NOR gates NR91 and NR92.

The fifth preliminary detector 3324 may generate the fifth preliminary signal FGR4_ARX2.5 when any of the first, second, fourth and fifth sequence signals SRCNT1, SRCNT2, SRCNT4 and SRCNT5 is activated. For example, the fifth preliminary detector 3324 may include the second and a third NOR gates NR92 and NR93, and a second NAND gate ND92. The third NOR gate NR93 may perform a logic NOR operation on the fourth and fifth sequence signals SRCNT4 and SRCNT5. The second NAND gate ND92 may perform a logic NAND operation on outputs of the second and third NOR gates NR92 and NR93.

The sixth preliminary detector 3326 may generate the sixth preliminary signal FGR4_ARX2.0 when any of the first, third and fourth sequence signals SRCNT1, SRCNT3 and SRCNT4 is activated. For example, the sixth preliminary detector 3326 may include a fourth NOR gate NR94, a second inverter INV92, and a third NAND gate ND93. The fourth NOR gate NR94 may perform a logic NOR operation on the first and third sequence signals SRCNT1 and SRCNT3. The second inverter INV92 may invert the fourth sequence signal SRCNT4. The third NAND gate ND93 may perform a logic NAND operation on outputs of the fourth NOR gate NR94 and the second inverter INV92.

The second flag generator 3328 may select any of the fourth to sixth preliminary signals FGR4_ARX3.0, FGR4_ARX2.5, and FGR4_ARX2.0 according to the rate setting signal TM<3:1> to generate the second flag signal FGR4_FLAG. The second flag generator 3328 may output the fourth preliminary signal FGR4_ARX3.0 as the second flag signal FGR4_FLAG when the first bit TM<1> of the rate setting signal TM<3:1> is activated. The second flag generator 3328 may output the fifth preliminary signal FGR4_ARX2.5 as the second flag signal FGR4_FLAG when the second bit TM<2> of the rate setting signal TM<3:1> is activated. The second flag generator 3328 may output the sixth preliminary signal FGR4_ARX2.0 as the second flag signal FGR4_FLAG when the third bit TM<3> of the rate setting signal TM<3:1> is activated. For example, the second flag generator 3328 may include fourth to seventh NAND gates ND94 to ND97. The fourth to sixth NAND gates ND94 to ND96 may perform a logic NAND operation on the first to third bits of the rate setting signal TM<3:1> and the fourth to sixth preliminary signals FGR4_ARX3.0, FGR4_ARX2.5, and FGR4_ARX2.0, respectively. The seventh NAND gate ND97 may perform a logic NAND operation on outputs of the fourth to sixth NAND gates ND94 to ND96.

The second decision component 336 may deactivate the second detection signal FGR4_ILLB to a logic high level when the second pulse signal FGR4BP is deactivated to a logic low level. The second decision component 336 may invert the second flag signal FGR4_FLAG and output an inverted signal as the second detection signal FGR4_ILLB, when the second pulse signal FGR4BP is activated to a logic high level. For example, the second decision component 336 may include an eighth NAND gate ND98 for performing a logic NAND operation on the second pulse signal FGR4BP and the second flag signal FGR4_FLAG.

The first detection circuit 310 and the second detection circuit 330 are not limited to the configurations shown in FIGS. 8 and 9, but can be implemented in various ways.

Hereinafter, referring to FIGS. 5 to 10, a method for generating the first detection signal FGR2_ILLB is explained.

Figure 10:
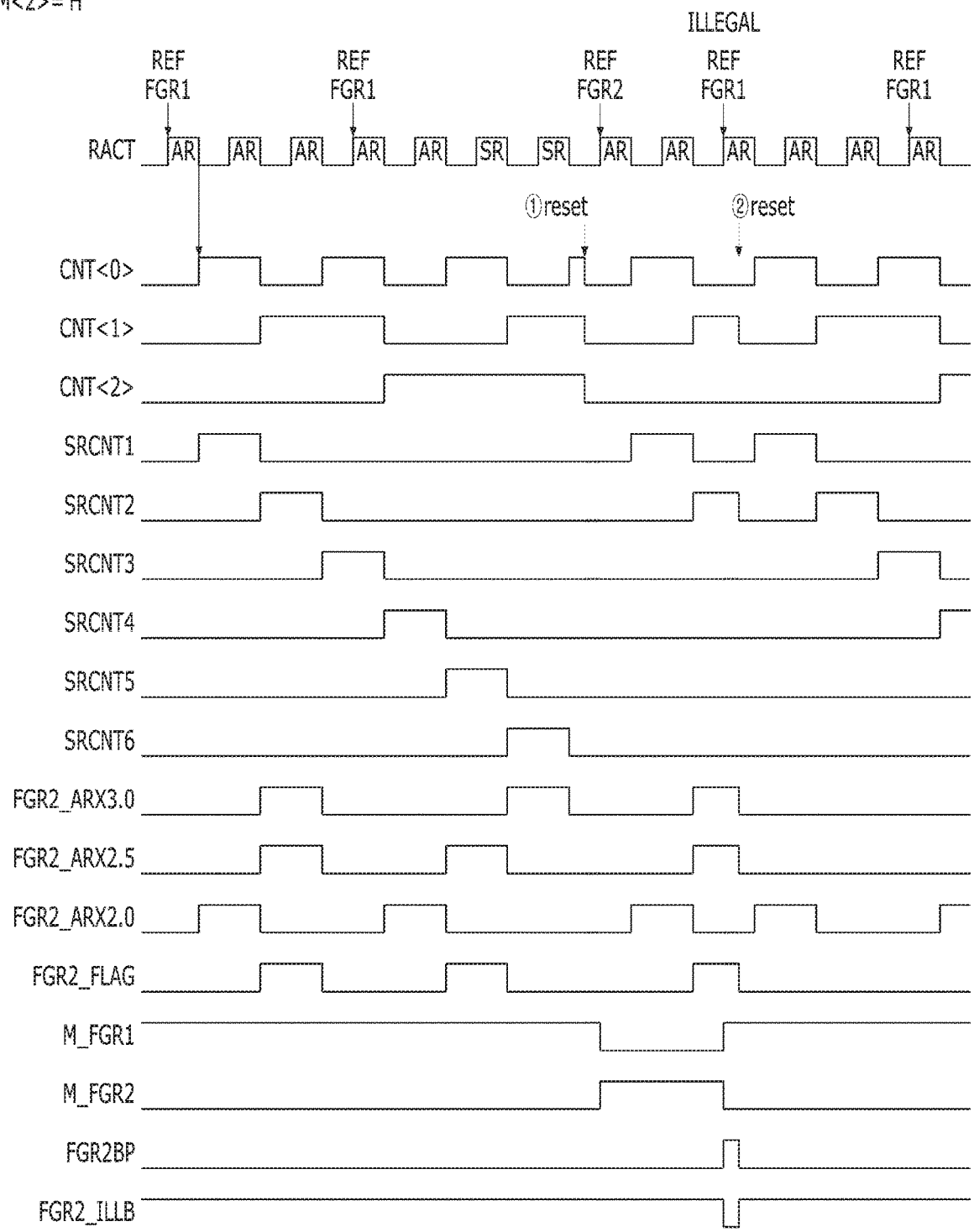
FIG. 10 is a timing diagram illustrating an operation of the first detection circuit.

FIG. 10 is a timing diagram describing an operation of the first detection circuit 310.

FIG. 10 shows an example where the second bit TM<2> of the rate setting signal TM<3:1> is activated. At this time, a refresh operation is performed with a refresh rate of [ARX2.5, SRX0.5].

According to a first input of a refresh command REF of a first mode FGR1, a first mode signal M_FGR1 is activated. The refresh control circuit 140 activates a row active signal RACT 3 times according to the first input of the refresh command REF. Thereafter, the refresh control circuit 140 activates the row active signal RACT 4 times according to a second input of the refresh command REF of the first mode FGR1 (see "FGR1" of FIG. 2B). The refresh counter 150 generates a counting signal CNT<2:0> by counting an activation number of the row active signal RACT, and generates first to sixth sequence signals SRCNT1 to SRCNT6, which are sequentially activated according to the counting signal CNT<2:0>. The refresh control circuit 140 generates a target completion signal SR2NDRSTB (not shown) activated when a target refresh operation is finished. The refresh counter 150 is initialized by the target completion signal SR2NDRSTB (①reset operation).

At this time, the first flag detector 312 activates a first preliminary signal FGR2_ARX3.0 when any of the second and sixth sequence signals SRCNT2 and SRCNT6 is activated. The first flag detector 312 activates a second preliminary signal FGR2_ARX2.5 when any of the second and fifth sequence signals SRCNT2 and SRCNT5 is activated. The first flag detector 312 activates a third preliminary signal FGR2_ARX2.0 when any of the first and fourth sequence signals SRCNT1 and SRCNT4 is activated. Since the second bit TM<2> of the rate setting signal TM<3:1> is activated, the first flag detector 312 outputs the second preliminary signal FGR2_ARX2.5 as the first flag signal FGR2_FLAG. The first decision component 316 deactivates a first detection signal FGR2_ILLB to a logic high level since a first pulse signal FGR2BP is deactivated to a logic low level.

Subsequently, according to a third input of a refresh command REF of a second mode FGR2, the first mode signal M_FGR1 is deactivated, and a second mode signal M_FGR2 is activated. The refresh control circuit 140 activates a row active signal RACT twice according to the third input of the refresh command REF. Thereafter, the refresh control circuit 140 should activate the row active signal RACT once according to a fourth input of the refresh command REF of the second mode FGR2 (see "FGR2" of FIG. 2B). However, as a result of a fourth input of the refresh command REF of the first mode FGR1, which is improper, the second mode signal M_FGR2 becomes deactivated. The first pulse generator 314 activates the first pulse signal FGR2BP to a logic high level for a given time, in synchronization with a falling edge of the second mode signal M_FGR2. The first decision component 316 inverts the first flag signal FGR2_FLAG to output the first detection signal FGR2_ILLB, when the first pulse signal FGR2BP is activated. The signal output section 350 outputs the first detection signal FGR2_ILLB as a detection signal indicating an improper refresh command FGR_ILLB. Accordingly, when the improper refresh command is detected, the refresh counter 150 is initialized by the detection signal FGR_ILLB (②reset operation).

A method for generating the second detection signal FGR4_ILLB may be performed in a manner substantially similar to that of FIG. 10.

Figure 11:
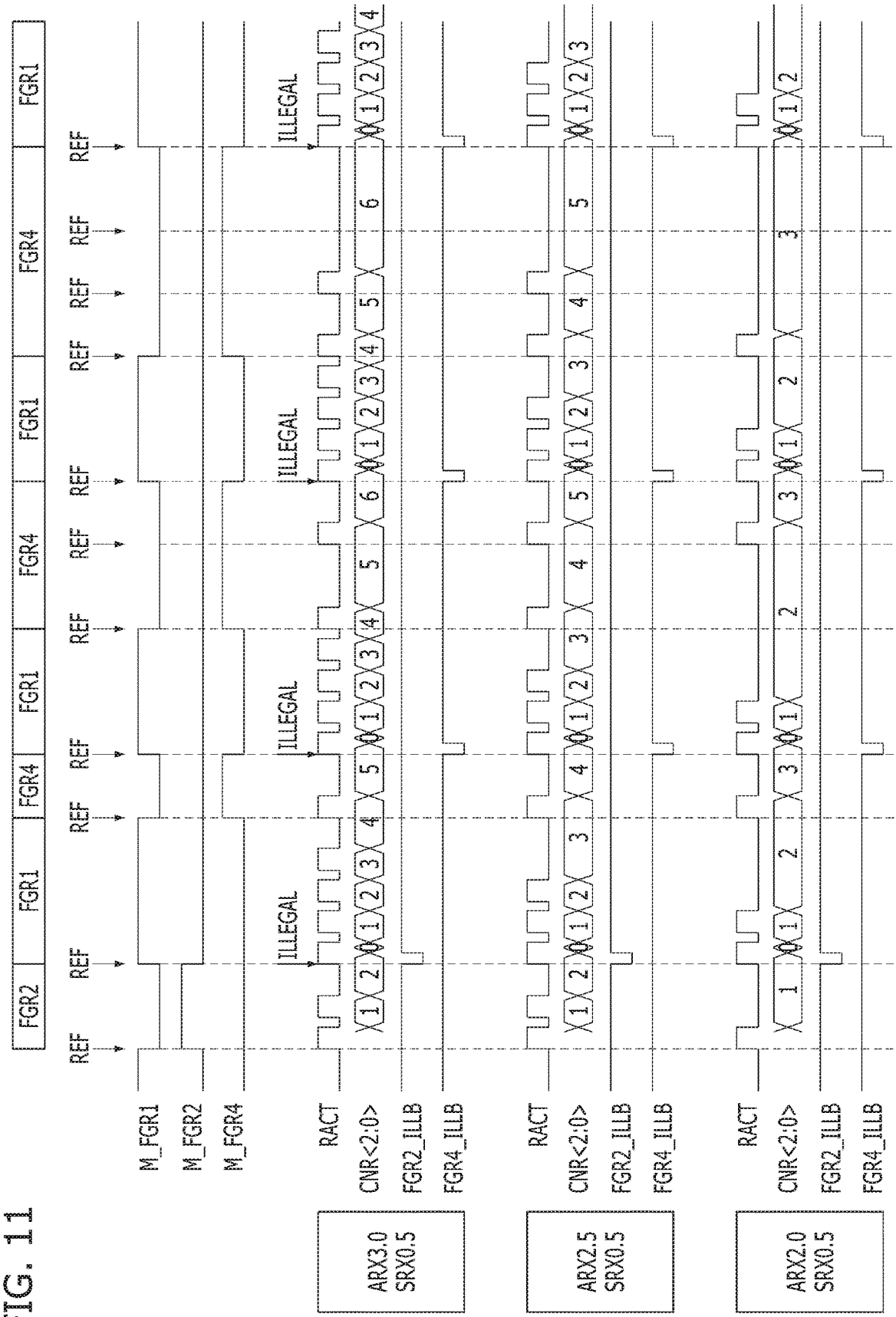
FIG. 11 is a timing diagram describing an operation of a semiconductor memory device in accordance with an embodiment of the present invention.

FIG. 11 is a timing diagram describing an operation of a semiconductor memory device in accordance with an embodiment of the present invention.

Referring to FIG. 11, a refresh command REF is inputted with any of first to third modes FGR1 to FGR4. When an improper refresh command is inputted, a first detection signal FGR2_ILLB or a second detection signal FGR4_ILLB is activated to a logic low level.

The refresh counter 150 is initialized when the first detection signal FGR2_ILLB or the second detection signal FGR4_ILLB is activated, thereby normally performing a refresh operation according to a next refresh command REF.

As mentioned above, the present invention can generate a detection signal in response to detecting application of an improper refresh command, and initialize a refresh counter according to the detection signal to ensure that a next refresh operation is performed normally.

Figure 12:
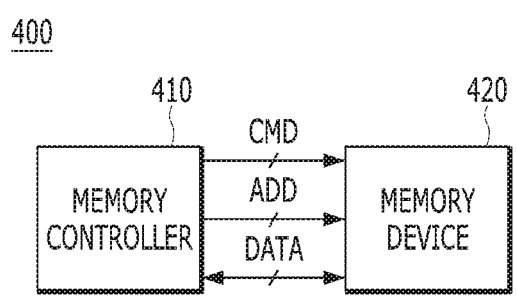
FIG. 12 is a block diagram illustrating a memory system in accordance with an embodiment of the present invention.

FIG. 12 is a block diagram illustrating a memory system 400 in accordance with an embodiment of the present invention.

Referring to FIG. 12, the memory system 400 may include a memory controller 410 and a memory device 420.

The memory controller 410 may control an operation of the memory device 420 by applying a commands CMD and an address ADD to the memory device 420, and to exchange data DATA with the memory device 420 during read and write operations. During a refresh operation, the memory device 420 may generate a mode setting command MRS and a refresh command REF by decoding the command CMD. The memory device 420 may set first to third mode signals M_FGR1, M_FGR2, and M_FGR4 for setting a Fine Granularity Refresh (FGR) mode, using the address ADD according to the mode setting command MRS. For reference, since the memory device 420 may internally generate a refresh address RADD during the refresh operation, the memory controller 410 does not need to provide the address ADD. The memory device 420 may generate a row active signal RACT in response to the refresh command REF and the first to third mode signals M_FGR1, M_FGR2, and M_FGR4. The memory device 420 may perform the refresh operation on at least one word line corresponding to the refresh address RADD, in response to the row active signal RACT. The memory device 420 may have substantially the same structure as that of the semiconductor memory device 100 of FIG. 3.

The memory controller 410 may apply the refresh command REF once during a unit refresh cycle (tRFC) when the memory device 420 is set to the first mode FGR1. The memory controller 410 may apply the refresh command REF twice during the unit refresh cycle (tRFC) when the memory device 420 is set to the second mode FGR2. The memory controller 410 may apply the refresh command REF 4 times during the unit refresh cycle (tRFC) when the memory device 420 is set to the third mode FGR4.

The memory device 420 may activate one of multi bits of a rate setting signal TM<3:1> according to a data retention time of memory cells. In particular, the refresh control circuit 140 of the memory device 420 may control an activation timing of the row active signal RACT according to the first to third mode signals M_FGR1 to M_FGR4, an activated bit of the rate setting signal TM<3:1> and a counting signal CNT<2:0>. The refresh counter 150 of the memory device 420 may generate the counting signal CNT<2:0> by counting an activation number of the row active signal RACT. The refresh counter 150 may generate first to sixth sequence signals SRCNT1 to SRCNT6, which are sequentially activated according to the counting signal CNT<2:0>. The refresh counter 150 may be initialized by a detection signal FGR_ILLB. The detection circuit 160 of the memory device 420 may generate first and second flag signals FGR2_FLAG and FGR4_FLAG by combining the first to sixth sequence signals SRCNT1 to SRCNT6 according to the rate setting signal TM<3:1>. When the second mode signal M_FGR2 is activated, the detection circuit 160 may generate the detection signal FGR_ILLB according to the first flag signal FGR2_FLAG. When the third mode signal M_FGR4 is activated, the detection circuit 160 may generate the detection signal FGR_ILLB according to the second flag signal FGR4_FLAG.

According to embodiments of the present invention, the semiconductor memory device can prevent a refresh error to allow a refresh operation to be stably and freely performed, by detecting an improper refresh command.

While the present invention has been illustrated and described with respect to the specific embodiments, it will be apparent to those skilled in the art in light of the present disclosure that various changes and modifications may be made without departing from the spirit and scope of the invention as defined in the following claims.

For example, the logic gates and transistors illustrated in the above embodiments may be positioned differently and be different types according to the polarity of an input signal.

What is claimed is:

1. A semiconductor memory device, comprising:
    a plurality of banks each suitable for refreshing at least one word line corresponding to a refresh address according to a row active signal;
    a refresh control circuit suitable for controlling, in response to a refresh command, an activation timing of the row active signal according to mode signals and a counting signal;
    a refresh counter suitable for generating the counting signal by counting the number of times the row active signal is activated, and generating sequence signals which are sequentially activated; and
    a detection circuit suitable for generating flag signals by combining the sequence signals, and generating a detection signal according to a corresponding one of the flag signals when any of the mode signals is activated,
    wherein the refresh counter is initialized by the detection signal.

2. The semiconductor memory device of claim 1, wherein the mode signals define a number of times the refresh command is to be provided during a unit refresh cycle.

3. The semiconductor memory device of claim 2, wherein the mode signals are set according to a mode setting command.

4. The semiconductor memory device of claim 1, wherein the refresh control circuit:
    controls the activation timing of the row active signal for a target refresh operation after controlling the activation timing of the row active signal for an advanced refresh operation; and
    generates a target completion signal when the target refresh operation is finished.

5. The semiconductor memory device of claim 4, further comprising:
    an address counter suitable for generating a counting address according to the row active signal during the advanced refresh operation; and
    a target address storing circuit suitable for storing a plurality of addresses, and providing a target address to the banks by selecting at least one of the stored addresses according to the row active signal during the target refresh operation, wherein the refresh address includes the counting address and the target address.

6. The semiconductor memory device of claim 4, wherein the refresh counter includes:
a reset generator suitable for generating an internal reset signal in response to the target completion signal or the detection signal;
a counter suitable for counting the number of times the row active signal is activated to generate the counting signal; and
a sequence generator suitable for combining respective bits of the counting signal to generate the sequence signals, and
wherein the counter is initialized by the internal reset signal.

7. The semiconductor memory device of claim 1, wherein the mode signal includes:
a first mode signal for defining a first fine granularity refresh (FGR) mode in which the refresh command is inputted once during a unit refresh cycle;
a second mode signal for defining a second FGR mode in which the refresh command is inputted twice during the unit refresh cycle; and
a first mode signal for defining a third FGR mode in which the refresh command is inputted 4 times during the unit refresh cycle.

8. The semiconductor memory device of claim 7, wherein the detection circuit includes:
a first detection circuit suitable for generating a first flag signal by combining the sequence signals according to a rate setting signal, and generating the detection signal according to the first flag signal and the second mode signal; and
a second detection circuit suitable for generating a second flag signal by combining the sequence signals according to the rate setting signal, and generating the detection signal according to the second flag signal and the third mode signal, and
wherein the rate setting signal defines an average number of times of refreshing per a single input of the refresh command.

9. The semiconductor memory device of claim 8, wherein the first detection circuit includes:
a first flag detector suitable for generating the first flag signal by combining the sequence signals according to the rate setting signal;
a first pulse generator suitable for generating a first pulse signal pulsing for a given time, when the second mode signal is activated; and
a first decision component suitable for outputting the first flag signal as the detection signal according to the first pulse signal.

10. The semiconductor memory device of claim 9, wherein the first flag detector includes:
a plurality of preliminary detectors suitable for generating a plurality of preliminary signals by combining two or more signals of the sequence signals; and
a first flag generator suitable for generating the first flag signal by selecting any of the preliminary signals according to the rate setting signal.

11. The semiconductor memory device of claim 8, wherein the second detection circuit includes:
a second flag detector suitable for generating the second flag signal by combining the sequence signals according to the rate setting signal;
a second pulse generator suitable for generating a second pulse signal pulsing for a given time, when the third mode signal is activated; and
a second decision component suitable for outputting the second flag signal as the detection signal according to the second pulse signal.

12. The semiconductor memory device of claim 11, wherein the second flag detector includes:
a plurality of preliminary detectors suitable for generating a plurality of preliminary signals by combining three or more signals of the sequence signals; and
a second flag generator suitable for generating the second flag signal by selecting any of the preliminary signals according to the rate setting signal.

13. A memory system comprising:
a memory controller suitable for providing a refresh command with mode signals; and
a memory device suitable for generating a row active signal according to the refresh command and the mode signals, and performing a refresh operation on at least one word line corresponding to a refresh address in response to the row active signal,
wherein the memory device includes:
a refresh control circuit suitable for controlling, in response to the refresh command, an activation timing of the row active signal according to the mode signals and a counting signal;
a refresh counter suitable for generating the counting signal by counting the number of times the row active signal is activated, and generating sequence signals which are sequentially activated; and
a detection circuit suitable for generating flag signals by combining the sequence signals, and generating the detection signal according to a corresponding one of the flag signals when any of the mode signals is activated,
wherein the refresh counter is initialized by the detection signal.

14. The memory system of claim 13, wherein the mode signals define a number of times the refresh command is to be provided during a unit refresh cycle.

15. The memory system of claim 13, wherein the refresh control circuit:
controls the activation timing of the row active signal for a target refresh operation after controlling the activation timing of the row active signal for an advanced refresh operation; and
generates a target completion signal when the target refresh operation is finished.

16. The memory system of claim 15, further comprising:
an address counter suitable for generating a counting address according to the row active signal during the advanced refresh operation; and
a target address storing circuit suitable for storing a plurality of addresses, and providing a target address to the banks by selecting at least one of the stored addresses according to the row active signal during the target refresh operation,
wherein the refresh address includes the counting address and the target address.

17. The memory system of claim 15, wherein the refresh counter includes:
a reset generator suitable for generating an internal reset signal in response to the target completion signal or the detection signal;

a counter suitable for counting the number of times the row active signal is activated to generate the counting signal; and a sequence generator suitable for combining respective bits of the counting signal to generate the sequence signals, and wherein the counter is initialized by the internal reset signal.

18. The memory system of claim 13, wherein the mode signal includes:
   a first mode signal for defining a first granularity refresh (FGR) mode in which the refresh command is inputted once during a unit refresh cycle;
   a second mode signal for defining a second FGR mode in which the refresh command is inputted twice during the unit refresh cycle; and
   a first mode signal for defining a third FGR mode in which the refresh command is inputted 4 times during the unit refresh cycle.

19. The memory system of claim 18, wherein the detection circuit includes:

a first detection circuit suitable for generating a first flag signal by combining the sequence signals according to a rate setting signal, and generating the detection signal according to the first flag signal and the second mode signal; and a second detection circuit suitable for generating a second flag signal by combining the sequence signals according to the rate setting signal, and generating the detection signal according to the second flag signal and the third mode signal, and wherein the rate setting signal defines an average number of times of refreshing per a single input of the refresh command.

* * * * *